(12) United States Patent
Clute et al.

(10) Patent No.: US 6,616,081 B1
(45) Date of Patent: Sep. 9, 2003

(54) BELT RETRACTOR WITH SWITCHABLE FORCE LIMITER

(75) Inventors: Günter Clute, Elmshorn (DE); Peer Gross, Hamburg (DE)

(73) Assignee: Autoliv Development AB (SE)

( * ) Notice: Subject to any disclaimer, the term of this patent is extended or adjusted under 35 U.S.C. 154(b) by 0 days.

(21) Appl. No.: 10/018,249

(22) PCT Filed: Jun. 14, 2000

(86) PCT No.: PCT/EP00/05474
§ 371 (c)(1),
(2), (4) Date: Feb. 15, 2002

(87) PCT Pub. No.: WO00/76814
PCT Pub. Date: Dec. 21, 2000

(30) Foreign Application Priority Data

Jun. 16, 1999 (DE) .......................... 199 27 427

(51) Int. Cl.⁷ .......................... B60R 22/28; B65H 75/48
(52) U.S. Cl. ...................................... 242/379.1; 280/805
(58) Field of Search ............... 242/379.1; 280/805–807

(56) References Cited

U.S. PATENT DOCUMENTS

| | | | |
|---|---|---|---|
| 5,785,269 A | * | 7/1998 | Miller et al. ............. 242/379.1 |
| 5,799,893 A | * | 9/1998 | Miller et al. ............. 242/379.1 |
| 5,820,056 A | * | 10/1998 | Dybro et al. ............... 242/374 |
| 5,887,814 A | | 3/1999 | Matsuki et al. |
| 6,012,667 A | * | 1/2000 | Clancy et al. ........... 242/379.1 |
| 6,105,893 A | * | 8/2000 | Schmidt et al. ............. 242/374 |
| 6,241,172 B1 | * | 6/2001 | Fugel et al. ............. 242/379.1 |

FOREIGN PATENT DOCUMENTS

| | | |
|---|---|---|
| DE | 19640842 A1 | 4/1998 |
| EP | 0773147 A2 | 5/1997 |
| WO | WO 96/32303 | 10/1996 |
| WO | WO 97/49583 | 12/1997 |
| WO | WO 98/36951 | 8/1998 |

* cited by examiner

*Primary Examiner*—Kathy Matecki
*Assistant Examiner*—Sang Kim
(74) *Attorney, Agent, or Firm*—R W Becker & Associates; R W Becker

(57) ABSTRACT

The invention relates to a belt retractor (10) with a switchable force limiter. Said belt retractor (10) comprises as the force limiter at least one energy absorbing element (13; 14, 15; 61) that is linked with the reel shaft (12) and with the locking device of the belt retractor (10) via a profiled bead (50). The belt retractor is further provided with a switch device with which the energy absorption is adjusted. The aim of the invention is to provide a switch device that functions independent of the transmission of power between the reel shaft and the torsion bar. Said switch device (latch 21) is designed in such a manner that it can be switched at any time during the already existing energy absorption via the drive (26) that is independent of the reel shaft (12) and/or the switch device.

15 Claims, 6 Drawing Sheets

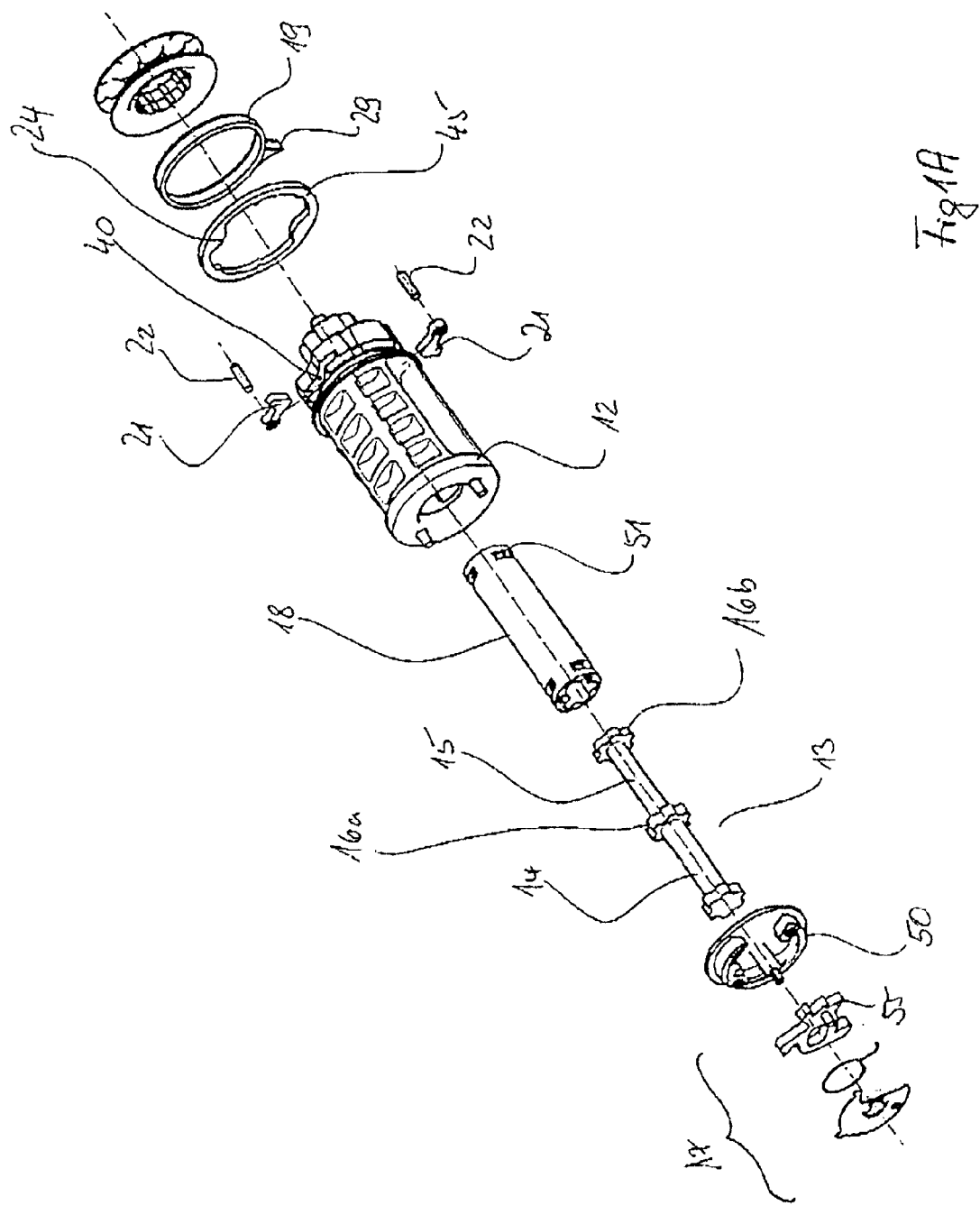

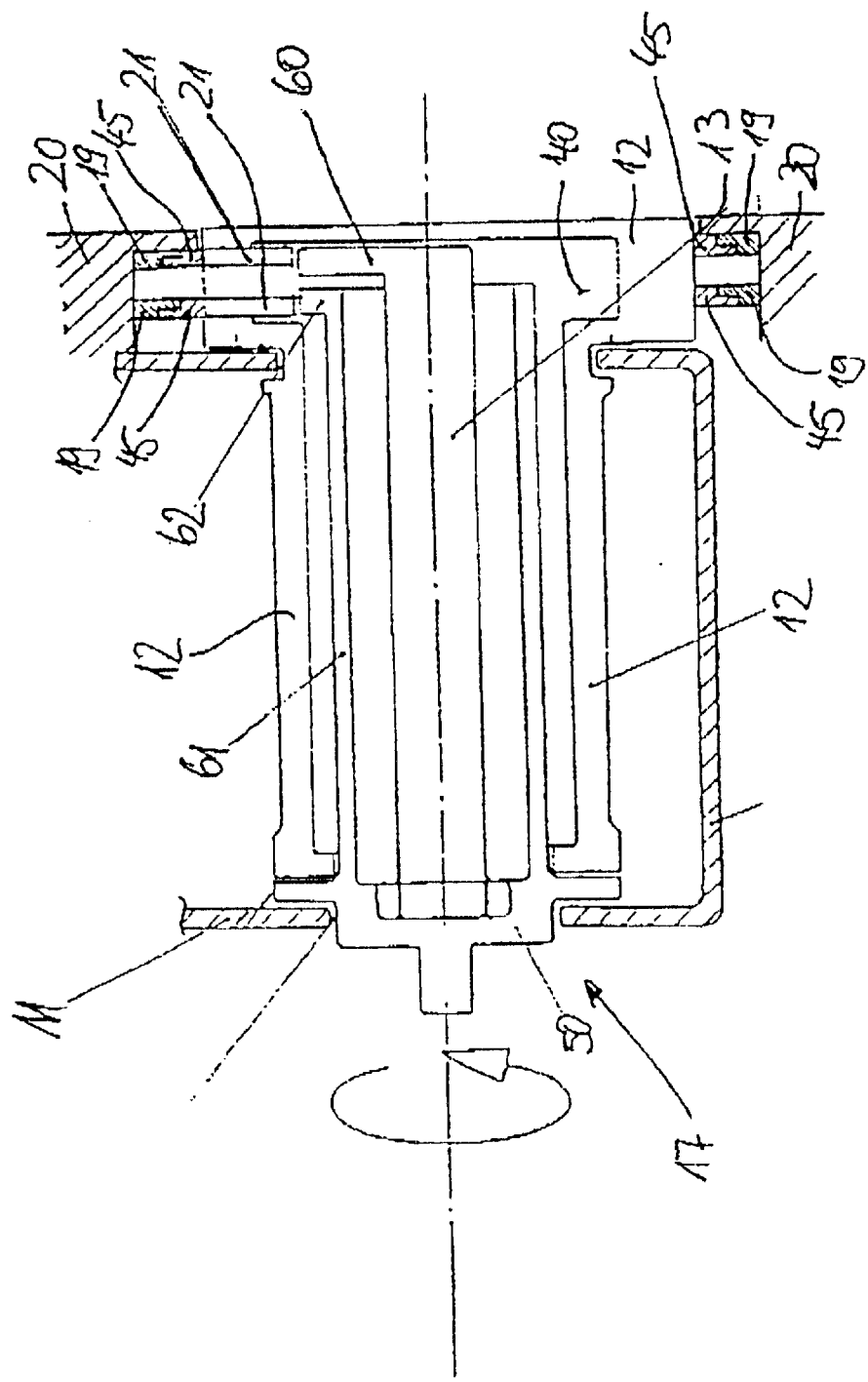

BELT RETRACTOR WITH SWITCHABLE FORCE LIMITER

BACKGROUND OF THE INVENTION

The present invention relates to a belt retractor provided with a force limiter, whereby the belt retractor has as a force limiting device at least one energy absorbing element that is linked to the spool and via a profiled head to the blocking apparatus of the belt retractor and a switching device is provided that adjusts the energy absorption and that is switchable via an independent drive. Such belt retractors can be designed both as self-blocking belt retractors with a vehicle-sensitive and/or belt-sensitive controllable blocking apparatus and as so-called limit fitting in accordance with EP 0 773 147 A2.

WO 97/49583, which forms the generic type, describes a self-blocking belt retractor with the features specified in the foregoing; in the exemplary embodiments individually detailed therein provided as energy absorbing element is a torsion bar with two or three sections switched one after the other, and also described is the arrangement of two energy absorbing elements switched parallel to one another. The associated switching device can only be switched under a load that is, can only be switched given the application of great actuating forces when energy absorption has already been turned on, because an existing force- or load-transferring coupling between the spool and torsion bar has to be overcome, i.e., there must be a switch to such a coupling. The design and operative complexity required for this is correspondingly high. The object of the invention is therefore to provide in a belt retractor having the generic features a reliable switching device that works independently of a force transfer already existing between spool and torsion bar.

This object is achieved including advantageous embodiments and further developments of the invention from the contents of the patent claims that follow this specification.

SUMMARY OF THE INVENTION

The basic idea of the invention is that the switching device, which can be switched at any time via the drive arranged independent from the spool and/or switching device has a pawl borne with a tendency to open that is held in its coupling position by means of a to spool ring that is displaceable in the direction of the spool axis, and in that the spool ring can be axially transferred by means of a pyrotechnically drivable adjusting apparatus into a position in which the spool ring makes it possible to reverse the pawl from its coupling position to its release position. Since the at least one pawl for connecting the torque tube and the spool is borne with a tendency to open, no more actuating forces occur for moving the pawl once the pawl has been released by the displacement of the spool ring.

In accordance with one exemplary embodiment of the invention, it is provided that at least two energy absorbing elements are provided arranged in series or parallel to one another, and that the switching device switches from one energy absorbing element to the other energy absorbing element when the drive is triggered.

In accordance with another exemplary embodiment of the invention, it is provided that the torsion bar has at least two sections with different cross-sections arranged in series to one another for a establishing a different energy absorption, and a torque tube is provided that connects at least one section of the torsion bar and the spool in a form-fit, as such a design of a belt retractor is known in principle from WO 97/49583.

In an alternative embodiment of two energy absorbing elements, it can be provided that a torsion sleeve is arranged connected in switched parallel to the torsion bar, and torsion sleeve or torsion bar can be switched off by means of the switching device allocated to the torsion sleeve and that allocated to the torsion bar.

In accordance with one exemplary embodiment of the invention, it can be provided that the spool ring is connected to the spool via form-fit designs and rotates together with it.

In particular, it can be provided that the pawl is pivotably borne in a recess in the cross-section of the spool, and the spool ring is arranged spanning the exterior circumference of the spool such that the spool ring in its position maintaining the pawl in its coupling position covers the recess.

For effecting the change in position of the spool ring, it can be provided that the control apparatus comprises a set collar that is arranged on the belt retractor rotatable under the effect of a drive across a limited area of rotation for displacing the spool ring and that is supported against a cover of the belt retractor by at least one ramp inclined in the axial direction of the spool and that can be displaced axially due to its twisting, whereby in accordance with one exemplary embodiment of the invention a plurality of ramps are distributed across the circumference of the set collar and the cover. Such a control apparatus is associated with the advantage of an additional servo-effect, since due to the helical movement produced in this manner only a small radial force must be applied in order to produce a much greater axial force for displacing the spool ring and therefore for producing the switch movement under a load.

With regard to the design of the drive for rotating the set collar, a linearly displaceable pyrotechnically driven piston can be provided that tangentially impacts a shoulder projecting radially from the set collar. This stationary external arrangement of the pyrotechnic drive substantially simplifies the electrical control, since it is not necessary to transfer electrical signals to the rotating spool and the pyrotechnics attached thereto.

The inventive coupling between torque tube and spool makes it possible in accordance with one exemplary embodiment of the invention to arrange a deformable element between spool and torque tube. In accordance with exemplary embodiments of the invention, the deformable element can be designed as shearing bars extending in the circumferential direction of spool and torque tube or as bending bars arranged radially between spool and torque tube. In an additional embodiment of the invention it can be provided that the deformable element is designed as bending bars arranged radially between spool and torque tube. This ensures a gentle transition from the first force level to the other force level.

With respect to the cooperation between the belt force limitation created in the belt retractor and the airbag located in the vehicle, the point in time at which the switch takes place from the higher force level to the lower force level is very important. For a control in this regard, in accordance with one exemplary embodiment of the invention it is provided that for igniting the drive for the control device a time switch is provided that is activated by the vehicle sensor and that involves a pre-selected period of time. In this exemplary embodiment of the invention, the ignition occurs at a pre-specified point in time independent of other accident conditions.

In an alternative embodiment of the invention it is provided that a device is provided for determining the revolutions of the spool under a load after a pre-selected threshold has been exceeded for determining the belt withdrawal effected by the force limitation, and the ignition of the drive for the set collar occurs when a pre-selected belt withdrawal has been achieved. In this embodiment of the invention, the belt withdrawal occurring during the accident and caused by the effect of the force limiting device of the belt retractor is used as a measure for switching the level of the force limiting device.

BRIEF DESCRIPTION OF THE DRAWING

The drawings illustrate exemplary embodiments of the invention that are described in the following: In the drawings:

FIG. 1A is the subject of FIG. 1 illustrated with the parts in an exploded view;

FIG. 9 is another exemplary embodiment of a belt retractor in accordance with FIG. 1 with two parallel-switched energy absorbing elements.

DESCRIPTION OF PREFERRED EMBODIMENTS

Figure 1:
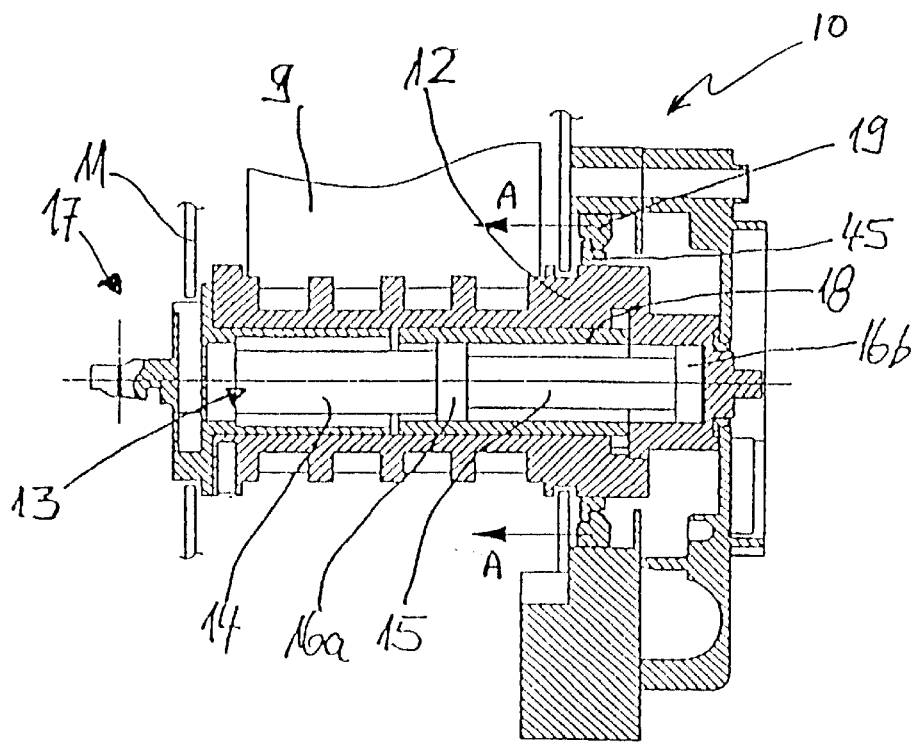
FIG. 1 is longitudinal view of a belt retractor with spool and a two-stage torsion bar including the switching device that has a first switch state (release of the pawl)

The belt retractor 10 visible in FIGS. 1 and 1A has a U-shaped frame in the lateral legs 11 of which a belt shaft or spool 12 is rotatably borne. A safety belt 9 is wound on the spool 12. Located in the interior of the spool as force limiting device is a torsion bar 13 that has a section 14 with a larger cross-section and a section 15 with a smaller cross-section, whereby provided between the sections 14, 15 and on the exterior end of the section 15 of the torsion bar 13 are connecting parts 16a, b by means of which the spool 12 is attached to the sections 14 and 15 of the torsion bar 13. On the exterior left side of the illustration in FIG. 1 is the blocking side 17 of the belt retractor, at which the torsion bar 13 is attached to a profiled head 50.

The spool 12 is coupled to the section 14 of the torsion bar 13 having the larger cross-section via a torque tube 18 that covers in a form-fit the associated connecting part 16a, while for connecting the spool 12 to the section 15 of the torsion bar 13 having the smaller diameter the spool 12 covers directly in a form-fit the connecting part 16b arranged on the right-hand end of the section 15. The switching device for switching the force limiting device from the higher force level to the lower force level is formed via pawls 21, shown in detail in FIG. 2, that couple the spool 12 and the torque tube 18 in a manner to be described such that when the pawls 21 are in the coupled position the force flow from the spool 12 via the torque tube 18 to the section 14 of the torsion bar 13 occurs such that when there is a corresponding load on the spool 12 from the pull exerted on the safety belt 9 the section 14 twists and makes possible the force limitation at a high level. If the pawls 21 are disengaged from the torque tube 18 by the actuation of the switching device which is yet to be explained, the spool 12 can rotate relative to the torque tube 18, and now the force flow occurs via the form-fit connection between the spool 12 and the connecting part 16b allocated to the section 15 of the torsion bar 13, so that the section 15 twists and the force can be limited at a lower level.

Figure 2:
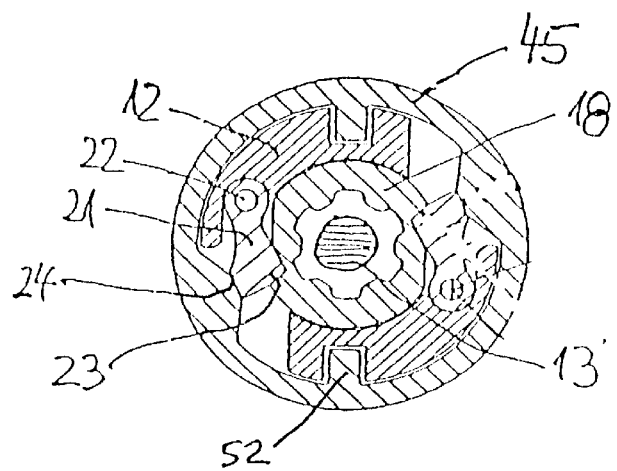
FIG. 2 is the switching device in accordance with FIG. 1 in a frontal view along the line A—A.

As can be seen in FIG. 2 in conjunction with FIG. 1a, the pawls 21 effecting the coupling between spool 12 and torque tube 18 in their coupling position are borne in a recess 40 formed in the cross-section of the spool 12 such that they can pivot about a center of rotation 22, whereby the spool 12 is surrounded on its exterior circumference by a spool ring 45 that spans the recesses 40 in the spool 12 and thereby via supports 24 holds the pawls 21 at their engaging noses 23 engaged with the recesses 51 of the torque tube 18. If the spool ring 45 is displaced in the axial direction, the pawls 21 are released from the support 24 of the spool ring 45 so that the pawls 21 that are borne with a tendency to open pivot outward into the recess 40 and thereby eliminate the connection between the spool 12 and the torque tube 18. The tendency to open that the pawls 21 have is adjusted via appropriate designs of the recesses 51 and of the engaging nose 23. The spool ring 45 is borne on the spool 12 in a form-fit via noses 52 engaging in the profile of the spool 12 and rotates with the spool 12.

Figure 3:
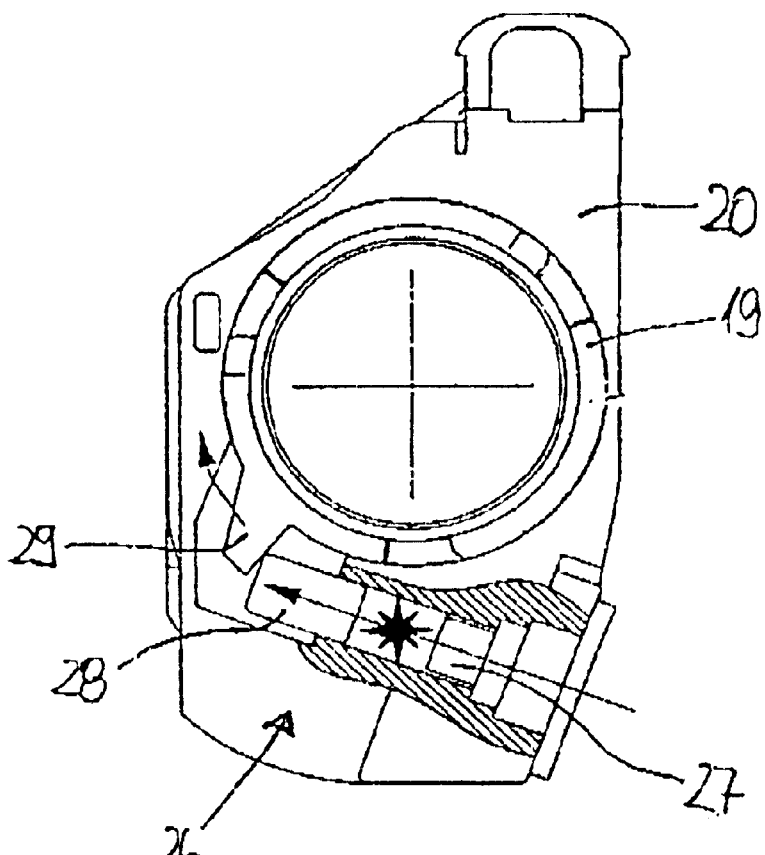
FIG. 3 is a schematic representation of the drive for the switching device.
Figure 4:
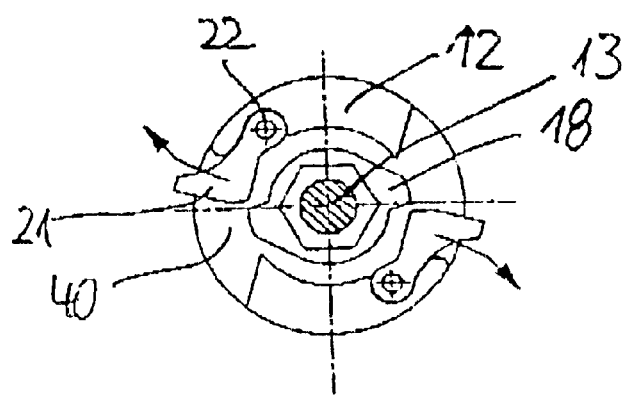
FIG. 4 is the switching device in accordance with FIG. 2 after the drive has been actuated.

The axial displacement of the spool ring 45 is introduced via the drive illustrated in FIG. 3, in which arranged in a cover 20 of the belt retractor 10 that covers the spool end is a drive 26 with a pyrotechnic charge 27 that impacts a piston 28, causing its linear movement. In its linear movement, the piston 28 acts on a shoulder 29 projecting radially from a set collar 19 such that the set collar 19 is caused to rotate when the piston 28 is actuated. The set collar 19 is borne on the housing 10 or on the cover 20 that is attached to the housing 10 and does not also rotate during the normal function of the spool 12. However, it can perform a limited rotational movement during its adjusting motion. The set collar 19 is supported against the cover 20 by inclined ramps (not shown in detail) arranged between set collar 19 and cover 20 so that due to the introduced twisting of the cover 20 the set collar 19 is pressed and thus axially displaced. This axial displacement of the set collar 19 is transferred to the spool ring 45 via the adjacent positions of the set collar 19 and spool ring 45 such that the displacement of the spool ring 45 leads to the release of the pawls 21, as described and illustrated in FIG. 4. In the illustrated exemplary embodiment, spool ring 45 and set collar 19 rest against one another via overlapping members so that the axial displacement of the set collar 19 is correspondingly transferable to the spool ring 45.

Figure 5:
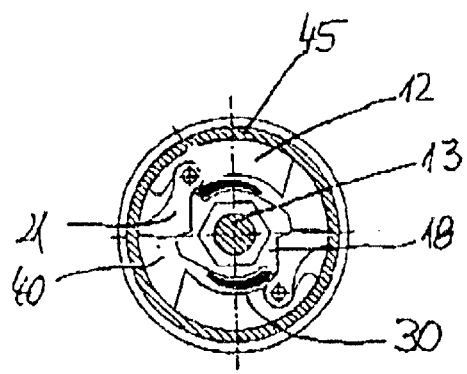
FIG. 5 is the switching device in accordance with FIG. 2 with additional shearing bars for adjusting an additional damping effect.
Figure 6A:
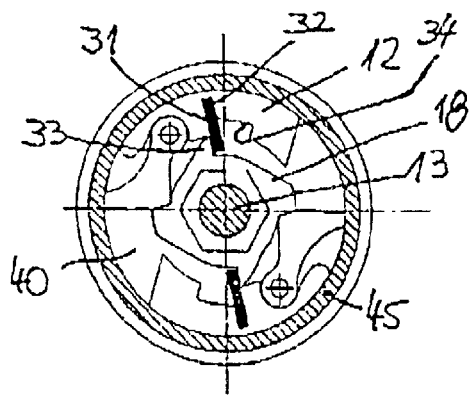
FIGS. 6a, b are the switching device in accordance with FIG. 2 with an additional bending bar.
Figure 6B:
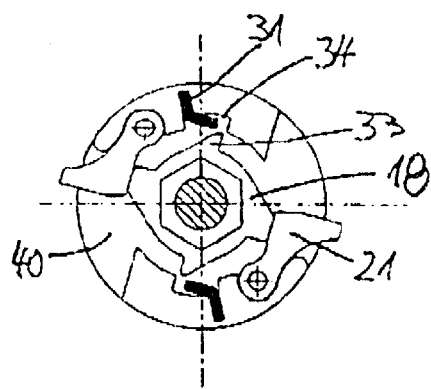
Figure 7A:
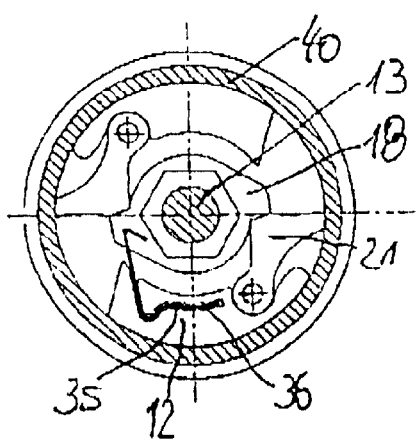
FIGS. 7a, b are the switching device in accordance with FIG. 2 with a strip-type deforming element.
Figure 7B:
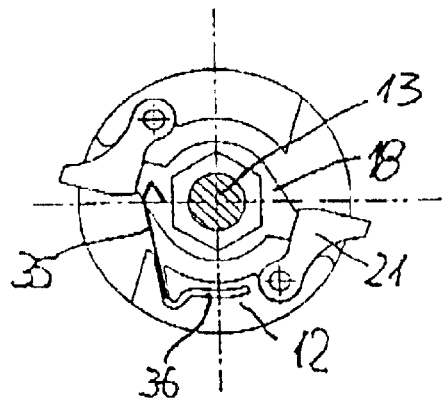

As can be seen in detail in FIGS. 5 through 7, in accordance with exemplary embodiments of the invention it is provided that an additional deformable element is arranged between the torque tube 18 and the spool 12 so that during the switching process from the higher level of force to the lower level of force of the torsion bar there is an additional gradation of the force transfer, that is, there is a more gentle transition; thus, with a two-stage torsion bar it is possible to set an additional third force characteristic. That is, if the pawls 21 pivot so that the spool 12 is uncoupled from the torque tube 18, during the further process while the section 15 of the torsion bar 13 is being switched to the spool 12 there is a relative rotation of the spool 12 to the torque tube 18, and at the beginning of this relative rotation a third energy absorbing element is switched on via deformable elements that are additionally arranged between the spool 12 and the torque tube 18 and that at the beginning of the switch to the lower force level first cause an additional dampening that occurs parallel to the section 15 of the torsion bar 13 via the provided deformable elements before, in the further process, there is force limiting only via the section 15 of the torsion bar 12.

In the exemplary embodiment illustrated in FIG. 5, arranged between spool 12 and torque tube 18 are two shearing bars that shear off during a relative rotation of the spool 12 to the torque tube 18.

In the exemplary embodiment illustrated in FIGS. 6a and 6b, two radially arranged bending bars 31 are provided that at their one end are in a recess 32 of the spool 12 and at their other end are adjacent to a member 33 on the torque tube 18 so that during a relative rotation between spool 12 and torque tube 18 the bending bars 31 first are bent into a free space 34 formed on the spool 12 before the section 15 of the torsion bar becomes effective due to the further rotation of the spool 12.

In the exemplary embodiment illustrated in FIGS. 7a, 7a, formed in the spool 12 as deformable element is a strip 35 made of a deformable material that is inserted in a channel 36 and is suspended at its end on the torque tube 18 and thus during a relative rotation between spool 12 and torque tube 18 is pulled out of the channel while deforming before the spool 12 due to its uncoupling from the torque tube 18 while continuing to rotate can engage the section 15 of the torsion bar 13.

For correct switching of the force limitation during an accident and thus for the interplay between the belt retractor equipped with a force limiter and an airbag arranged in the vehicle, the point in time at which the force limiter is switched is very important because the belt withdrawal enabled by the force limiter to a certain degree causes a pre-positioning of the belted person for whom the inflating airbag is intended.

Although not illustrated, it is possible to determine the best point in time for the switching process, that is, for igniting the pyrotechnic charge 27, to trigger this ignition across a specified point in time in that a period of time is pre-selected in an appropriately provided control unit, and after this period of time has elapsed the pyrotechnic charge 27 is ignited.

Figure 8:
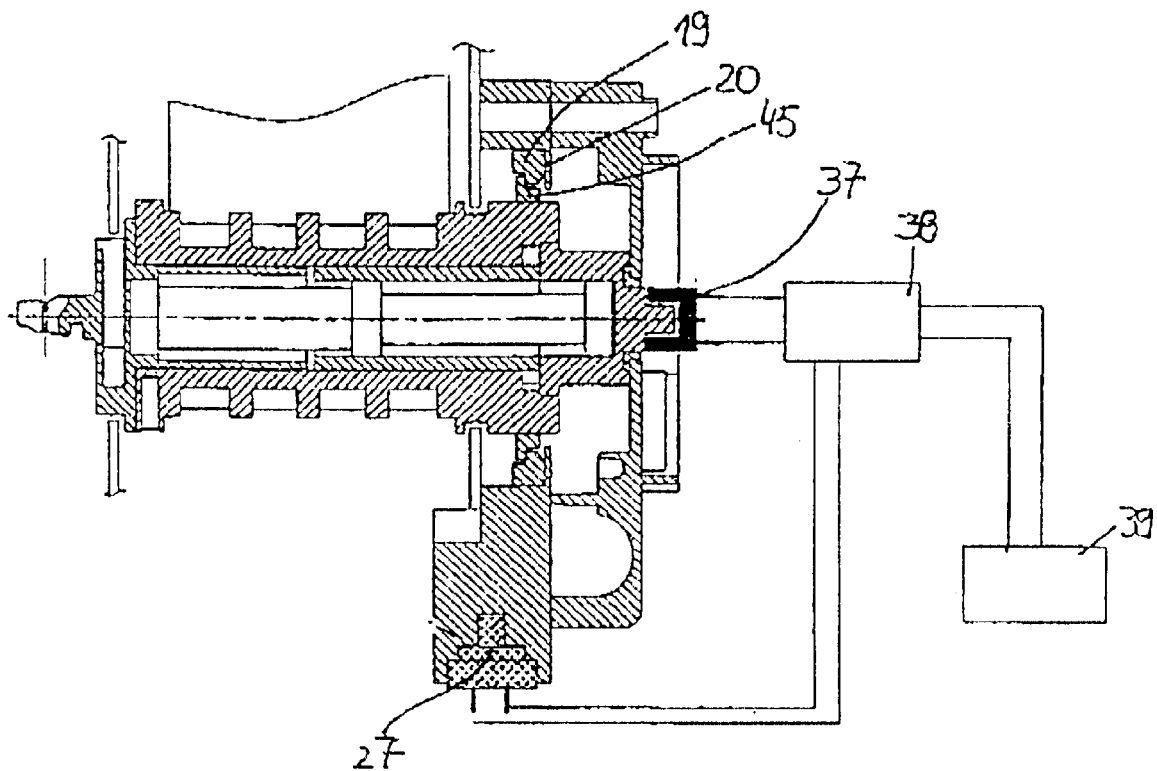
FIG. 8 is the subject of FIGS. 1 and 3 in connection with a control of the switching time of the switching device as a function of the belt withdrawal in a second switching state (blocking the pawls)

FIG. 8 illustrates an alternative option for the control in which the belt withdrawal caused by the effect of the force limiting device of the belt retractor is used as a measure for igniting the pyrotechnic unit 27. In this case, a measuring device 37 is provided on the belt retractor 10, for instance in the form of a potentiometer that determines the speed of the spool rotations or the angular velocity. When the value thus acquired exceeds a threshold value, this is identified as the beginning of the force limitation, and further belt withdrawal is detected via the potentiometer. The angular velocity of the spool 12 during normal, manual belt withdrawal when the safety belt is being put on and during blocking of the belt retractor is substantially lower than when the force limiting device, that is, the energy absorbing elements, have been triggered. The angular velocity during the force limiting process is approximately ten times higher than during normal belt withdrawal. Stored in a control unit 39 provided on the vehicle is a specific measure of belt withdrawal as a prerequisite for igniting the pyrotechnic charge 27, and when in another provided belt retractor control unit 38 the belt withdrawal speed determined by the potentiometer equals the value pre-specified by the control unit 39 of the vehicle, the control unit 38 initiates ignition of the pyrotechnic charge 27. At this point in time the force limiting device then switches from the higher force level to the lower force level.

Finally, FIG. 9 illustrates one exemplary embodiment of the invention with two energy absorbing elements oriented parallel to one another. In this exemplary embodiment, as well, the spool 12 is rotatably borne in the housing legs 11. At the blocking-side end 17 of the belt take-up spool 13, the spool on its front side is allocated a profiled head 50 that rotates in the U-shaped leg 11 of the housing, whereby borne on the profiled head 50 is an anti-blocking member 55 that can be radially deflected under the effect of a control device (indicated but not shown) and that due to the control in the case of a delay is guided into the teeth arranged in the associated through-hole in the housing.

The profiled head 50 and the spool 12 are connected to one another by a torsion bar 13 acting as force limiting device in that the one end of the torsion bar 13 is connected in a form-fit to the profiled head 50 and the other end of the torsion bar 13 running in the spool 12 is attached to the spool 12. The spool 12 widens beyond the lateral leg opposite the blocking side 17 in order to form the recess 40 necessary for bearing the pawls 21. The first exterior pawl 21 borne on the outermost end of the spool 12 engages a radially projecting flange 60 of the torsion bar 13 so that when the pawl 21 is blocked the spool 12 is connected to the torsion bar 13. The pawl 21 is kept engaged by an associated exterior spool ring 45, whereby a first set collar 19 is also allocated to the first spool ring 45.

Provided as additional energy absorbing element is a torsion sleeve 61 that covers the torsion bar 13 and is attached to the profiled head 50 and that also has adjacent to the flange 60 of the torsion bar 13 a radial flange 62, to which is allocated a second pawl 21 that is borne on the spool 12 and located in its recess 40 and that is kept engaged by a second spool ring 45, which is itself controllable by a second set collar 19. With this arrangement, different levels of energy absorption can be controlled by controlling the two pawls 21.

The features of the subject of this document disclosed in the foregoing specification, patent claims, abstract, and drawings can be essential individually and in any combination to realizing the invention in its various embodiments.

The specification incorporates by reference the disclosure of German priority document 199 27 427.4 filed Jun. 16, 1999 and PCT/EP00/05474 filed Jun. 14, 2000.

The present invention is, of course, in no way restricted to the specific disclosure of the specification and drawings, but also encompasses any modifications within the scope of the appended claims.

What is claimed is:

1. A belt retractor comprising:
   a force limiting device in the form of at least one energy absorbing element which is connected to a spool for a belt and is also connected via a profiled head with a blocking apparatus of said retractor;
   a switching device for adjusting energy absorption, wherein said switching device is switchable at any point in time via a drive mechanism that is independent of at least one of said spool and said switching device, wherein said switching device is provided with a least one pawl that is mounted so as to have a self-opening tendency;

a spool ring for holding said at least one pawl in a coupling position, wherein said spool ring is displaceable in a direction of an axis of said spool; and a pyrotechnically drivable adjusting means for axially transferring said spool ring into a position in which said spool ring enables a changeover of said at least one pawl from the coupling position thereof into a release position thereof.

2. A belt retractor according to claim 1, wherein at least two energy absorbing elements are provided and are disposed in series with or parallel to one another, and wherein said at least one pawl switches from one of said energy absorbing elements to the other energy absorbing element when said drive mechanism is triggered.

3. A belt retractor according to claim 1, wherein a torsion bar is provided as an energy absorbing element and is provided with at least two sections that have different cross-sections and are disposed in series with one another for the purpose of establishing a different energy absorption, and wherein a torque tube is provided that positively connects at least one of said sections of said torsion bar and said spool.

4. A belt retractor according to claim 3, wherein a deformable element is disposed between said spool and said torque tube.

5. A belt retractor according to claim 4, wherein said deformable element is embodied as shearing bars that extend in a circumferential direction of said spool and said torque tube.

6. A belt retractor according to claim 4, wherein said deformable element is embodied as bending bars that are radially disposed between said spool and said torque tube.

7. A belt retractor according to claim 4, wherein said deformable element is a strip of deformable material disposed in a channel of said spool, and wherein one end of said strip is secured to said torque tube and upon rotation of said torque tube can be pulled out of said channel accompanied by deformation.

8. A belt retractor according to claim 1, wherein a torsion bar is provided as an energy absorbing element, wherein a torsion sleeve is connected in parallel to said torsion bar, and wherein said torsion sleeve or said torsion bar can be switched off by means of said at least one pawl that is respectively associated with said torsion sleeve and said torsion bar.

9. A belt retractor according to claim 1, wherein said spool ring is connected with said spool via positively engaging elements and rotates together therewith.

10. A belt retractor according to claim 1, wherein at least one pawl is pivotably mounted in a recess in a cross-section of said spool, and wherein said spool ring spans an outer periphery of said spool in such a way that said spool ring covers said recess when said spool ring is in its position where it holds said at least one pawl in the coupling position thereof.

11. A belt retractor according to claim 1, wherein said adjusting means, for a displacement of said spool ring, comprises a set collar that is disposed on said belt retractor and is rotatable over a limited range under the effect of said drive mechanism, and wherein said set collar is supported against a cover of said belt retractor by at least one ramp inclined in the axial direction of said spool and can be displaced axially via rotation thereof.

12. A belt retractor according to claim 11, wherein a plurality of ramps are distributed over a periphery of said set collar and said cover.

13. A belt retractor according to claim 1, wherein said adjusting means comprises a rotatable set collar, and wherein said drive mechanism for rotating said set collar is provided with a linearly displaceable pyrotechnically driven piston that tangentially acts upon a shoulder that radially projects from said set collar.

14. A belt retractor according to claim 1, wherein for ignition of said drive mechanism for said adjusting means, a time switch is provided that is activated by a vehicle sensor and involves a pre-selected period of time.

15. A belt retractor according to claim 1, wherein a device is provided for determining revolutions of said spool under load after a pre-selected threshold has been exceeded for the purpose of determining belt retraction effected by said force limiting device, and wherein ignition of said drive mechanism for said adjusting means is effected when a pre-selected belt withdrawal has been achieved.

\* \* \* \* \*